US012330102B2

(12) United States Patent
Dekkers et al.

(10) Patent No.: US 12,330,102 B2
(45) Date of Patent: *Jun. 17, 2025

(54) FILTER FOR A PLASMA PLUME

(71) Applicant: Lam Research Corporation, Fremont, CA (US)

(72) Inventors: Jan Matthijn Dekkers, Aadorp (NL); Kristiaan Hendrikus Aloysius Bohm, Deventer (NL); Willem Cornelis Lambert Hopman, Deventer (NL); Jeroen Aaldert Heuver, Enschede (NL); Jan Arnaud Janssens, Schalkhaar (NL)

(73) Assignee: LAM RESEARH CORPORATION, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/298,853

(22) Filed: Apr. 11, 2023

(65) Prior Publication Data

US 2023/0241535 A1 Aug. 3, 2023

Related U.S. Application Data

(63) Continuation of application No. 17/178,638, filed on Feb. 18, 2021, now Pat. No. 11,628,389.

(30) Foreign Application Priority Data

Feb. 19, 2020 (EP) ..................................... 20158312

(51) Int. Cl.
*B01D 45/14* (2006.01)
*C23C 14/28* (2006.01)
(Continued)

(52) U.S. Cl.
CPC .............. *B01D 45/14* (2013.01); *C23C 14/28* (2013.01); *B01D 46/00* (2013.01);
(Continued)

(58) Field of Classification Search
CPC .... B01D 45/14; B01D 46/00; B01D 46/4227; C23C 14/28; C23C 14/54; C23C 14/564; H01J 37/32871
See application file for complete search history.

(56) References Cited

U.S. PATENT DOCUMENTS

2007/0209934 A1  9/2007  Meyer
2019/0093527 A1  3/2019  Sheridan
(Continued)

FOREIGN PATENT DOCUMENTS

CN    110665302 A    1/2020
EP    2410074 A1     1/2012
(Continued)

OTHER PUBLICATIONS

Yoshitake, T. et al., "Droplet-Free Thin Films Prepared by Pulsed Laser Deposition Using a Vane Velocity Filter", Japanese Journal of Applied Physics, vol. 41, No. 2R, Feb. 2002, 2 pages.
(Continued)

*Primary Examiner* — Dung H Bui
(74) *Attorney, Agent, or Firm* — Alleman Hall & Tuttle LLP

(57) ABSTRACT

A filter for a pulsed laser deposition device includes a housing with two pass-through openings arranged in the housing wall and forming a pass-through channel for passing at least part of the plasma plume through the housing, which pass-through channel extends from one side of the housing to an opposite side of the housing, at least one primary blade arranged at a distance from and rotatable around a rotation axis, with the path of the at least one
(Continued)

primary blade intersecting with the pass-through channel and with the at least one primary blade having a contact surface for contact with the plasma plume, and a drain channel connecting to a drain opening arranged in the housing wall.

20 Claims, 6 Drawing Sheets

(51) Int. Cl.
- *B01D 46/00* (2022.01)
- *B01D 46/42* (2006.01)
- *C23C 14/54* (2006.01)
- *C23C 14/56* (2006.01)
- *H01J 37/32* (2006.01)

(52) U.S. Cl.
CPC .......... *B01D 46/4227* (2013.01); *C23C 14/54* (2013.01); *C23C 14/564* (2013.01); *H01J 37/32871* (2013.01)

(56) References Cited

U.S. PATENT DOCUMENTS

| | | |
|---|---|---|
| 2020/0002805 A1* | 1/2020 | Janssens ............... C23C 14/564 |
| 2021/0102522 A1 | 4/2021 | Parikh |
| 2021/0146288 A1 | 5/2021 | Han et al. |

FOREIGN PATENT DOCUMENTS

| | | |
|---|---|---|
| EP | 3587620 A1 | 1/2020 |
| JP | S6461389 A | 3/1989 |
| JP | H1030169 A | 2/1998 |
| JP | 2003049262 A | 2/2003 |
| JP | 2006249558 A | 9/2006 |
| WO | 2019139178 A1 | 7/2019 |

OTHER PUBLICATIONS

Japan Patent Office, Notice of Allowance Issued in Application No. 2021-018239, Jan. 7, 2025, 5 pages.

* cited by examiner

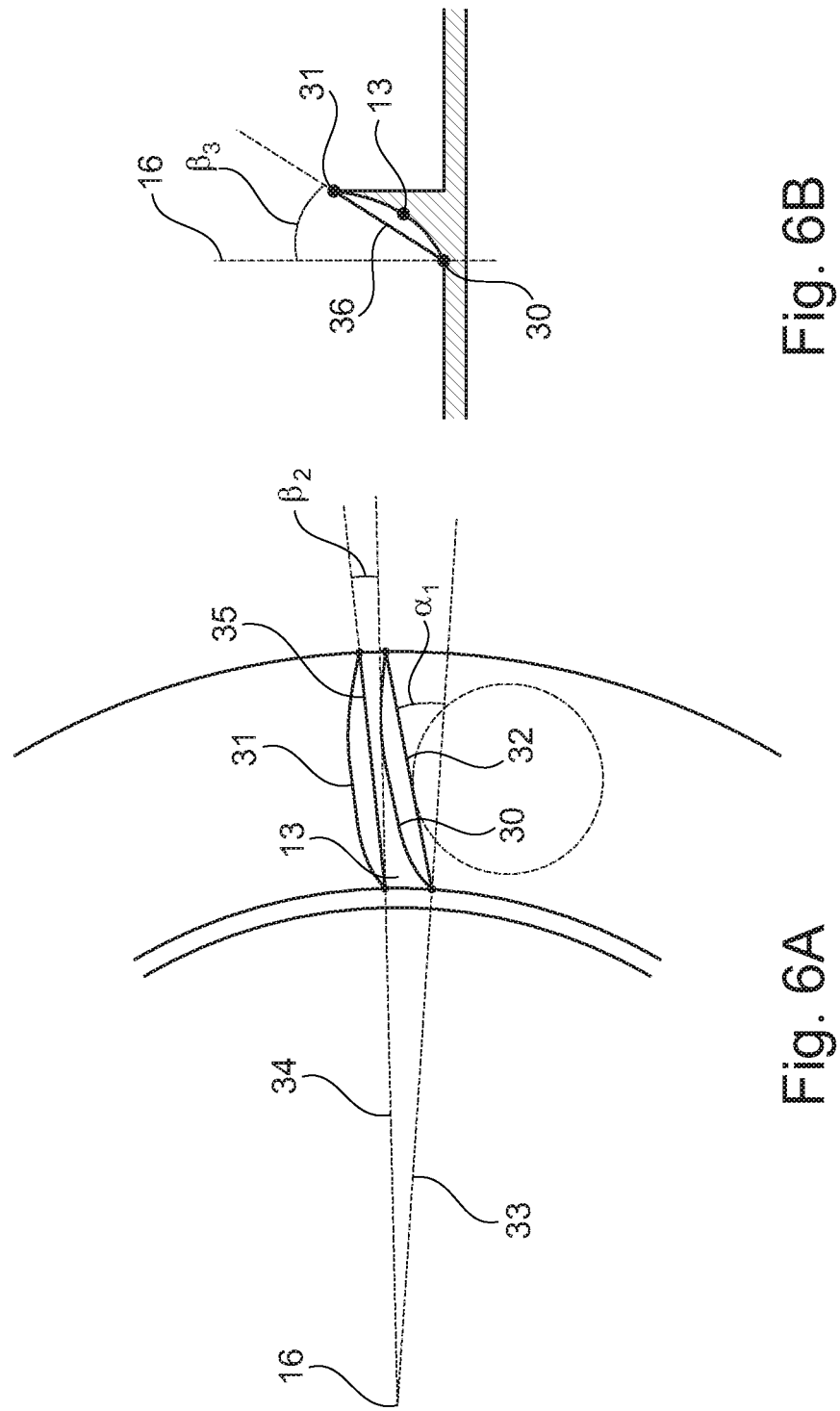

FILTER FOR A PLASMA PLUME

CROSS-REFERENCE TO RELATED APPLICATION

This application is a continuation of U.S. patent application Ser. No. 17/178,638, filed Feb. 18, 2021, which claims priority to European Patent Application No. 20158312.7 filed Feb. 19, 2020, the disclosures of each of which is hereby incorporated by reference in their entirety.

BACKGROUND OF THE INVENTION

Field of the Invention

The invention relates to a filter for filtering particles from a plasma plume, which filter includes a housing with two pass-through openings arranged in the housing wall and forming a pass-through channel for passing at least part of the plasma plume through the housing, which pass-through channel extends from one side of the housing to an opposite side of the housing; and at least one primary blade arranged at a distance from and rotatable around a rotation axis, which rotation axis is parallel and spaced apart from the center line of the pass-through channel, wherein the path of the at least one primary blade intersects with the pass-through channel and wherein the at least one primary blade has a contact surface for contact with the plasma plume, which contact surface is facing in the direction of the rotation direction.

Description of Related Art

Such a filter is for example known from EP 2410074.

When a plasma plume is generated by directing a laser pulse onto a target material, a plasma of target material will emerge from the surface of the target. Because a lot of energy is put into the target material, a lot of heat is locally generated, which also causes particles to break loose from the target material. Such undesired particles will trail the plasma plume and will also be deposited on a substrate, when no filtering is applied. The resulting layer on the substrate will have a suboptimal quality. It is therefore desired to filter the undesired particles from the plasma plume, such that only the plasma will be deposited onto the substrate.

EP 2410074 discloses filter for filtering particles from a plasma plume, which filter has a cage like housing with a closed top surface and a closed bottom surface spaced apart from the top surface by posts arranged along the circumference, resulting in an open side surface. Both top surface and bottom surface have pass-through openings to form a pass-through channel for passing at least part of the plasma plume. Inside of the housing, a rotatable disc of a number of rotatable vanes are arranged. The rotation of the vanes is synchronized with the generation of the plasma plume, typically by pulsing a laser onto a target material. When the plasma plume passes the pass-through channel, the rotatable disc of vanes will wipe the trailing part of the plasma plume away.

EP 2410074 suggests that the undesired particles in the plasma plume are caught by the rotatable disc or vanes. Although this may be partially true, the applicant has found that in order to optimize such filtering systems, it is better to consider the undesired particles to behave substantially like marbles and which just simply bounce off from the rotatable disc or vanes and are dispersed into the space. As EP 2410074 uses a housing with an open structure, the undesired particles simply bounce off to the outside of the housing of the filter, where the substrate is typically located and on which the undesired particles will still be deposited.

Simply closing the housing of EP 2410074 will probably result in worse filtering properties, as the particles will be bounced around by the rotating disc or vanes and when a new plasma plume passes through the pass-through channel a part of the bouncing particles will be carried along with the plasma plume and still arrive at the substrate.

SUMMARY OF THE INVENTION

Accordingly, it is an object of the invention to reduce or even resolve the above mentioned disadvantages and to provide a filter with improved filtering of particles from a plasma plume.

This object is achieved according to the invention with a filter according to the preamble, which filter is characterized by a drain channel connecting to a drain opening arranged in the housing wall, wherein a line extending perpendicular from both the center line of the pass-through channel and a radial line extending from the rotation axis through the center line of the pass-through channel and through the path of the at least one primary blade, extends through the drain opening.

With the filter according to the invention a drain channel is provided along which the particles can be drained. The contact surface of the at least primary blade ensures that when the primary blade swipes through the cloud of particles trailing the plasma plume, the particles are directed towards the drain opening in the housing and the drain channel.

In a preferred embodiment of the filter according to the invention the cord line of the radial cross-section of the contact surface makes an angle larger than 0°, preferably larger than 15° with the rotation axis. The cord-line is arranged such that closer to the source of the plasma plume, the contact surface trails more, than further away from the source of the plasma plume. This ensures that the fastest particles are captured by the part of the contact surface further away from the source, while the slower or delayed particles in the plasma plume are captured by the more trailing part of the contact surface.

In a further preferred embodiment of the filter according to the invention the cord line of the axial cross-section of the contact surface makes an angle larger than 0°, preferably larger than 15° with the radial line extending from the rotation axis and through the inner edge of the axial cross-section of the contact surface.

The angle with the radial line allows for the particles to be directed towards the drain opening. More preferably, the angle of the cord line of the axial cross-section of the contact surface varies along the radial direction. When a plasma plume is generated on a target surface, the plasma and undesired particles will depart in all directions, such that an expanding plasma plume grows. The varying angle takes the different directions of the particles better into account.

In yet a further preferred embodiment of the filter according to the invention the contact surface is a concave shaped surface facing in the direction of the rotation direction of the at least one primary blade.

If only a flat surface would be used for the blade, then the particles will scatter more, due to the expanding plasma plume, when hitting the flat surface. The concave shaped surface allows for a more focused direction of the particles, allowing them to be drained along the drain channel. So, the concave surface has a varying direction in both radial direction as well as in the direction of the rotation axis.

It is generally noted that when an angle larger than 0° is defined, it is considered that such an angle is within the range of 0° and 180°, while an angle smaller than 0° is considered to be within the range of 0° and −180°. Thus an angle of for example −5° should not be considered an angle larger than 0°, by adding 360°, such that the angle would be equal to 355°.

It is apparent for a person skilled in the art, that the shaped of the concave surface depends on the process parameters, such as the velocity of the plasma plume, the particles trailing the plasma plume and the rotational speed of the blade.

A preferred embodiment of a filter according to the invention further comprises a disc rotatable arranged in the housing, wherein the rotation axis of the disc coincides with the rotation axis of the at least one primary blade, wherein at least one pas s-through opening is arranged in the disc at a distance from the rotation axis corresponding with the distance of the center line of the pass-through channel to the rotation axis, and wherein the at least one primary blade is arranged on top of the disc adjacent to and trailing, when viewed in the rotation direction of the disc, the at least one pass-through opening in the disc.

The rotating disc provides a shutter for the pass-through channel, such that after passage of the plasma plume the pass-through channel is closed and the particles, which need to be filtered from the plasma plume can be swept towards the drain channel by the at least one primary blade.

In another embodiment of the filter according to the invention the rotation axis of the disc could also be parallel and spaced apart from the rotation axis of the at least one primary blade as long as there is an overlap, when viewed in the direction of the rotation axes, between the primary blade and the pass-through opening in the disc.

In a further preferred embodiment of the filter according to the invention a cylindrical wall is arranged on the disc and concentrically with the rotation axis and the at least one primary blade connects to the outside of the cylindrical wall.

The cylindrical wall provides a border on the radial inside, whereas the housing provides a border on the radial outside, such that after closure of the pass-through channel the particles are more confined. Even if the particles would bounce off the primary blade in a wrong direction, the cylindrical wall and the housing wall could contribute in redirecting the particles towards the drain opening.

Yet another embodiment of the filter according to the invention, further comprises a secondary blade arranged rotatable around the rotation axis and trailing each at least one primary blade.

By arranging a secondary blade behind each primary blade, particles, which are not caught by the primary blade, can still be caught by the secondary blade. This is in particular relevant for particles, which are relatively slow or otherwise delayed with respect to the plasma generation and follow the plasma plume at a relative large distance. These particles will not have arrived at the pass-through channel, when the primary blade swipes through the pass-through channel. So, these particles will enter the pass-through channel behind the primary blade, but in front of the secondary blade, with which the slow or delayed particles are bounced towards the drain opening.

Preferably, the angle between the longitudinal axis of the at least one primary blade and a radial line extending from the rotation axis to the proximal end of the at least one primary blade is smaller than the angle between the longitudinal axis of the secondary blade trailing the respective at least one primary blade and a radial line extending from the rotation axis to the proximal end of said secondary blade.

Because, the secondary blade is arranged just behind the primary blade and the secondary blade bounces off particles, which are substantially slower than the particles bounced off by the primary blade, the angle of the secondary blade typically needs to be different in order to also direct the slower particles towards the drain opening.

In yet another embodiment of the filter according to the invention a number of auxiliary blades is arranged at a distance from and rotatable around the rotation axis and which number of auxiliary blades is distributed along the path and at a distance from the at least one primary blades.

By providing a number of auxiliary blades, a fan is provided inside the housing, which will urge the remaining particles into the direction of the drain channel.

A preferred embodiment of the filter according to the invention further comprises an auxiliary drain channel connecting to an auxiliary drain opening arranged in the housing wall, and pump means to generate a pressure difference between the rotation axis and the auxiliary drain channel.

By providing a pressure difference between the rotation axis, i.e. the center of the housing and the auxiliary drain channel a flow will be induced towards said drain channel. This flow is of advantage to maintain pressure in the housing. The flow can be designed by providing injection openings radially inside of the blades.

BRIEF DESCRIPTION OF THE DRAWINGS

These and other features of the invention will be elucidated in conjunction with the accompanying drawings.

FIGS. 6A and 6B show an axial top view and a cross-sectional radial view of the primary blade with a concave surface as shown in FIG. 5 on enlarged scale.

DESCRIPTION OF THE INVENTION

Figure 1:
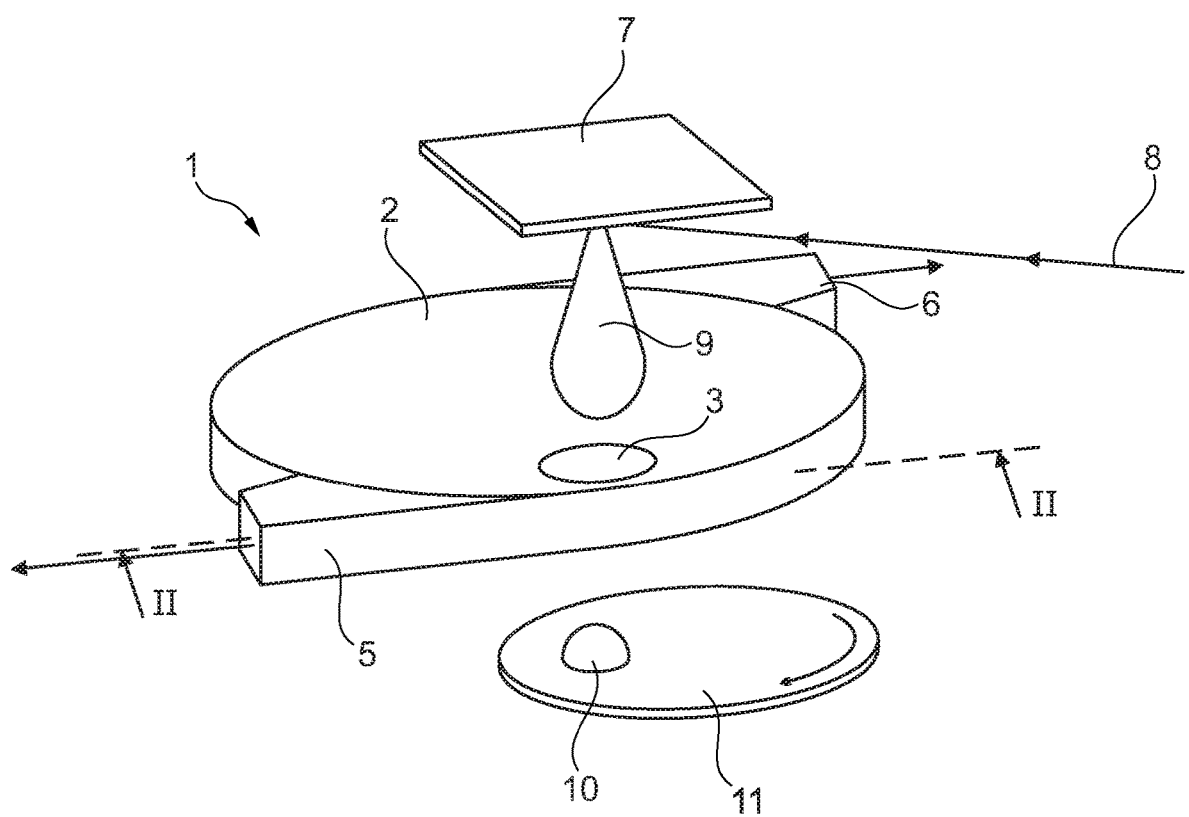
FIG. 1 shows a schematic perspective view of an embodiment of a filter according to the invention arranged in a PLD device.

FIG. 1 shows a schematic view of an embodiment 1 of a filter according to the invention. The filter 1 has a housing 2 with a pass-through opening 3 at the top and a pass-through opening 4 at the bottom (see FIG. 2). The housing 2 is provided with a drain channel 5 and an auxiliary drain channel 6.

A target material 7 is arranged above the pass-through opening 3 of the filter 1. If a laser beam 8 is pulsed onto the target material 7, a plasma plume 9 will be generated.

This plasma plume 9 will enter the pass-through opening 3, where undesired particles are filtered, such that a filtered plasma plume 10 will exit the filter 1 through the pass-through opening 4. The filtered plasma plume 10 is then deposited onto a substrate 11.

Figure 2:
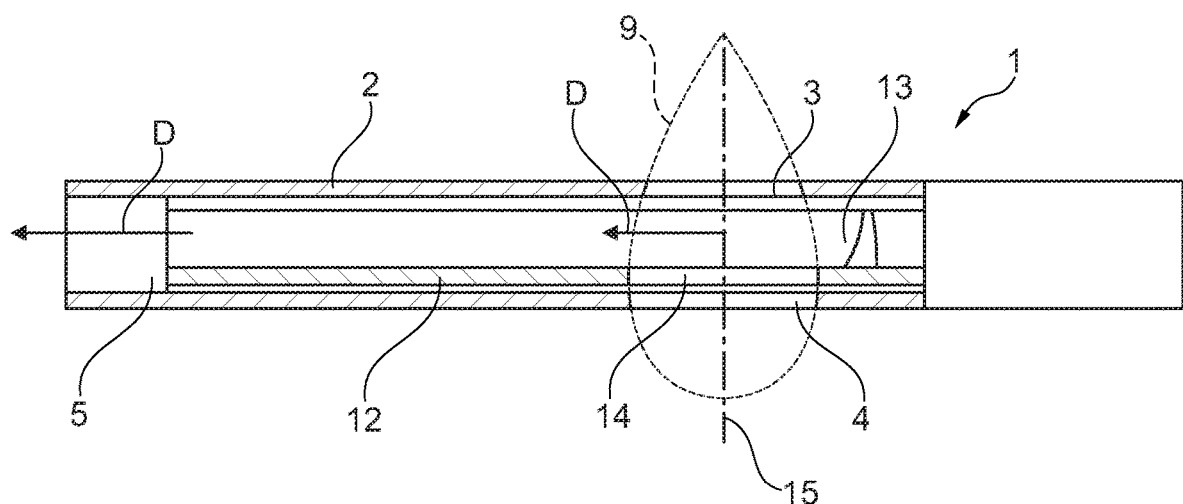
FIG. 2 shows a cross-sectional view along the line II-II in FIG. 1.

As shown in FIG. 2, a disc 12 is arranged rotatably in the housing 2 of the filter 1. On top of the disc a primary blade with a concave surface 13 is provided adjacent to a pass-through opening 14, which allows passage of a plasma plume 9, when the pass-through opening 14 is aligned with the pass-through openings 3, 4 in the housing 2 and forming a pass-through channel with a center line 15.

When the plasma plume 9 passes through the formed pass-through channel, the primary blade with concave surface 13 with swipe through the last part of the plasma plume 9 and will bounce undesired particles in the direction D to the drain opening and the connected drain channel 5.

Figure 3:
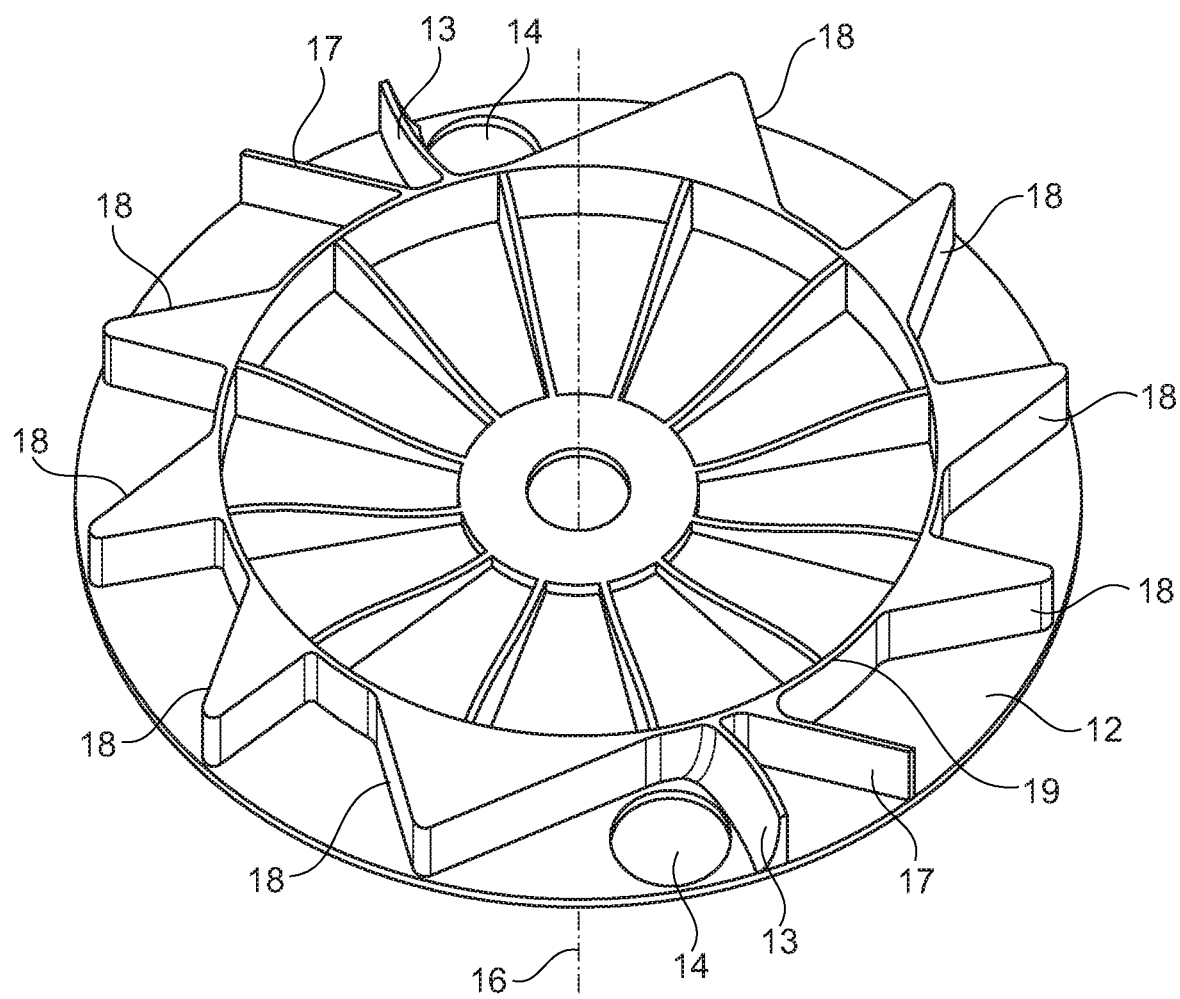
FIG. 3 shows a perspective view of the disc with blades of the filter according to FIG. 1.

FIG. 3 shows a perspective view of the disc 12 rotatably arranged around the rotation axis 16 in the housing 2 of the filter 1.

The disc 12 is provided with two oppositely arranged pass-through openings 14, which are each trailed by a primary blade 13 having a concave surface. Just behind each primary blade 13, a secondary blade 17 is arranged to bounce off particles towards the drain channel 5, which particles are too slow to be hit by the primary blade 13. Furthermore, a number of auxiliary blades 18 are arranged on top of the disc 12.

A cylindrical wall 19 is arranged radially inside of the primary blades 13, secondary blades 17 and auxiliary blades 18 to provide together with the housing 2 a more confined space for the undesired particles of the plasma plume 9.

Figure 4:
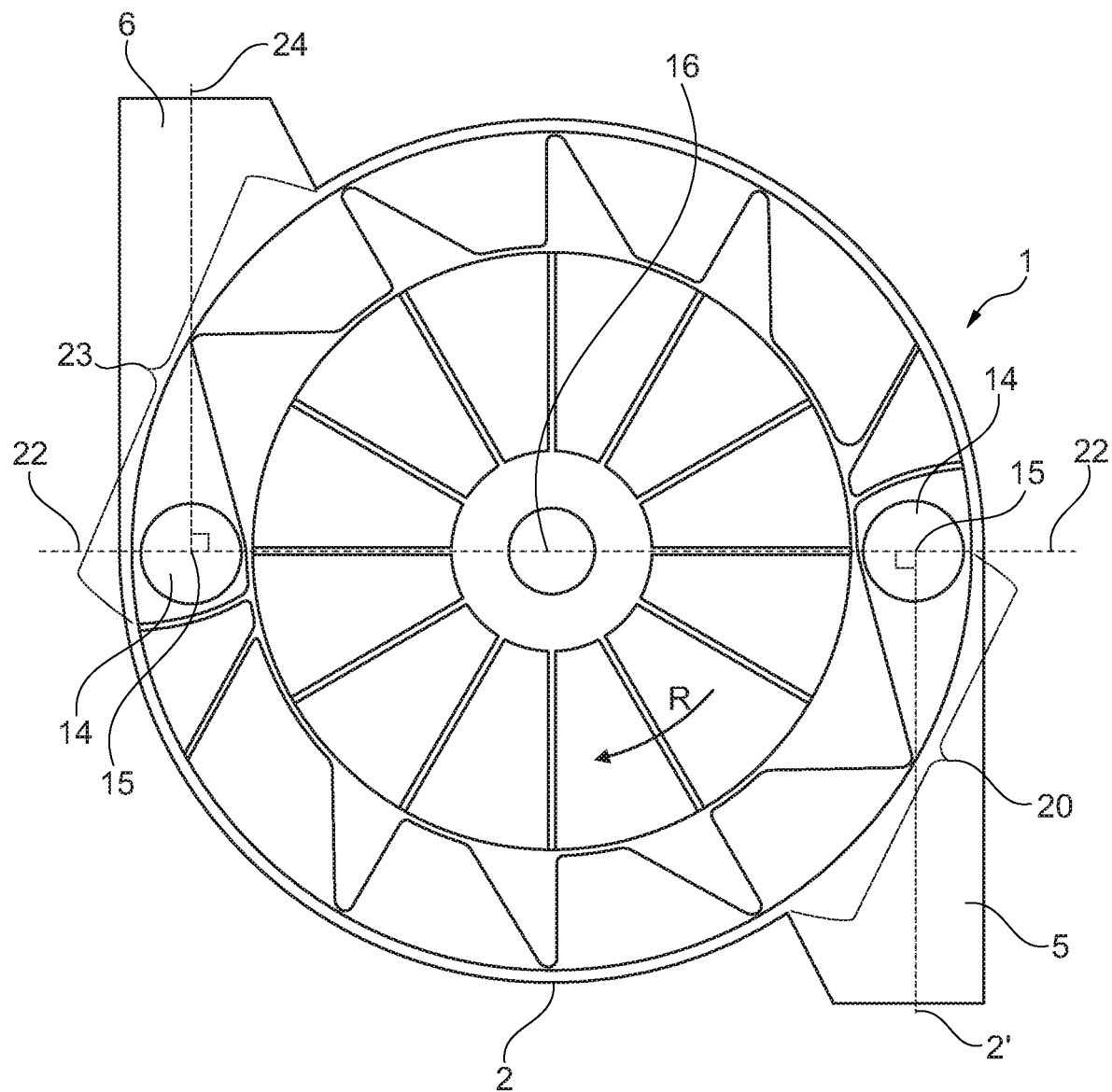
FIG. 4 shows top cross-sectional view of the filter according to the invention in a first state.

FIG. 4 shows a cross-sectional top view of the filter 1 of the invention.

The housing 2 has a drain opening 20, on which the drain channel 5 is connected. This drain opening 20 is arranged on a line 21 extending perpendicular from both the center line 15 of the pass-through channel and a radial line 22 extending from the rotation axis 16 through the center line 15 of the pass-through channel.

The housing 2 has also an auxiliary drain opening 23, on which the auxiliary drain channel 6 is connected. This drain opening 23 is arranged on a line 24 extending perpendicular from both the center line 15 of the pass-through channel and a radial line 22 extending from the rotation axis 16 through the center line 15 of the pass-through channel.

FIG. 5 shows again the cross-sectional top view of the filter 1 of the invention. From this FIG. 5 it is clear that the radial line 25 extending from the rotation axis 16 to the proximal end of the primary blade 13 makes an angle $\alpha 1$ with the longitudinal axis 26 of the primary blade.

The radial line 27 extending from the rotation axis 16 to the proximal end of the secondary blade 17 makes an angle $\alpha 2$ with the longitudinal axis 28 of the secondary blade 17.

The radial line 29 extending from the rotation axis 16 to the proximal end of the auxiliary blade 18 makes an angle $\alpha 3$ with the longitudinal axis 50 of the auxiliary blade 18.

As already described above, the primary blade 13 has a concave surface which focuses the particles from the plasma plume 9 hit by the primary blade 13 in a bundle 51 towards the drain opening 20 and the drain channel 5.

Furthermore, a pressure difference is generated between the center of the filter 1, around the rotation axis 16 and the auxiliary drain channel 6, such that an airflow L is generated which flows from the center towards the outside of the housing 2 in order to maintain pressure within the housing.

Figure 5:
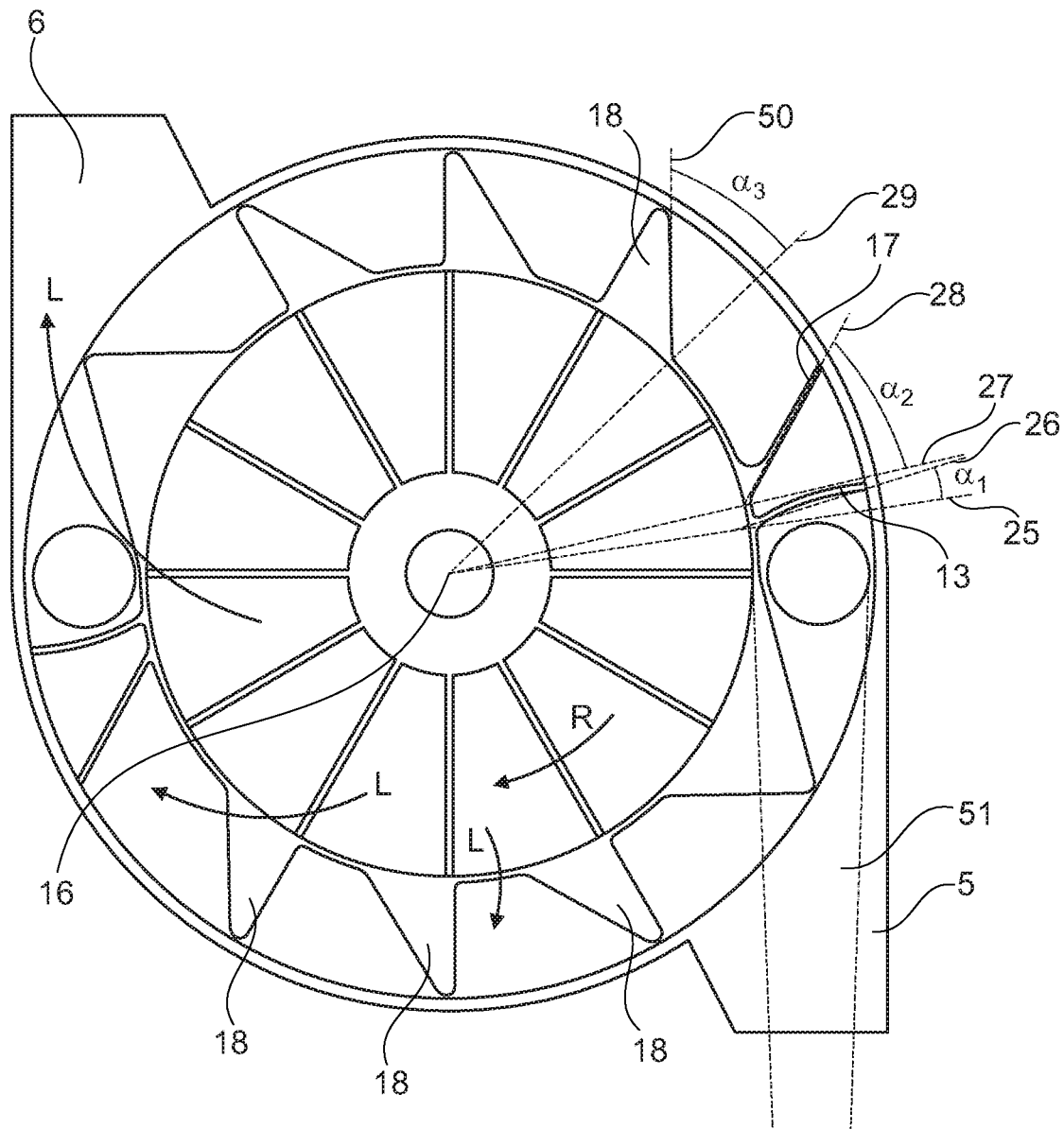
FIG. 5 shows top cross-sectional view of the filter according to the invention in a second state.

FIGS. 6A and 6B show an axial top view and a cross-sectional radial view of the primary blade with a concave surface 13 as shown in FIG. 5 on enlarged scale.

The concave surface 13 is curved from the bottom edge 30 towards the top edge 31 of the concave surface 13 and also in radial direction.

The cord line 32 of the bottom edge 30 makes an angle $\alpha 1$ with the radial line 33, which intersects with the most inner edge of the cord line 32. The cord line 35 of the top edge 31 makes an angle $\beta 2$ with the radial line 34, which intersects with the most inner edge of the cord line 32.

Both angles $\alpha 1$ and $\beta 2$ are larger than 0° and preferably larger than 15°.

FIG. 6B shows a cross-sectional radial view of the concave surface 13. The cord line 36 makes an angle $\beta 3$ with the rotation axis 16. Also this angle $\beta 3$ is larger than 0° and preferably larger than 15°.

The invention claimed is:

1. A filter for filtering particles from a plasma plume, the filter comprising:
   a housing comprising
      a housing wall,
      two pass-through openings arranged in the housing wall to form a pass-through channel for passing at least part of the plasma plume through the housing, which pass-through channel extends from one side of the housing to an opposite side of the housing, and
      a drain opening arranged in a border on a radial outside of the housing wall;
   at least one primary blade arranged within the housing at a distance from and rotatable around a rotation axis, wherein a path of the at least one primary blade intersects with the pass-through channel, wherein the at least one primary blade has a contact surface for contact with the plasma plume, and wherein the housing wall is configured to direct particles contacted by the contact surface of the at least one primary blade toward the drain opening; and
   a drain channel connected to the drain opening such that the drain channel extends from the housing.

2. The filter according to claim 1, wherein the contact surface comprises a concave shape facing in a rotation direction of the at least one primary blade.

3. The filter according to claim 2, wherein a cord line of a radial cross section of the contact surface makes an angle larger than 15 degrees with the rotation axis.

4. The filter according to claim 1, further comprising a disc arranged in the housing, the disc comprising at least one pass-through opening arranged in the disc.

5. The filter according to claim 4, wherein the at least one primary blade is arranged on the disc.

6. The filter according to claim 5, wherein the at least one primary blade is arranged adjacent to and trailing, when viewed in a rotation direction of the disc, the at least one pass-through opening in the disc.

7. The filter according to claim 5, wherein a cylindrical wall is arranged on the disc and concentrically with the rotation axis, and wherein the at least one primary blade connects to the cylindrical wall.

8. The filter according to claim 1, further comprising a secondary blade arranged to be rotatable around the rotation axis and to trail the at least one primary blade in a direction of rotation about the rotation axis.

9. The filter according to claim 8, wherein an angle between a longitudinal axis of the at least one primary blade and a radial line extending from the rotation axis to a proximal end of the at least one primary blade is smaller than an angle between a longitudinal axis of the secondary blade and a radial line extending from the rotation axis to a proximal end of the secondary blade.

10. The filter according to claim 1, further comprising a plurality of auxiliary blades arranged at a distance from and rotatable around the rotation axis.

11. The filter according to claim 9, wherein the housing further comprises an auxiliary drain opening in the border on the radial outside of the housing wall, and the filter further comprises an auxiliary drain channel connected to the auxiliary drain opening.

12. A pulsed laser deposition device configured to transfer material from a target to a substrate by pulsed laser deposition, the pulsed laser deposition device comprising:
   a laser; and
   a filter for filtering particles from a plasma plume, the filter comprising
      a housing comprising a housing wall,
         two pass-through openings arranged in the housing wall to form a pass-through channel for passing at least part of the plasma plume through the housing, which pass-through channel extends from one side of the housing to an opposite side of the housing, and
         a drain opening arranged in a border on a radial outside of the housing wall;
      at least one primary blade arranged within the housing at a distance from and rotatable around a rotation axis, wherein a path of the at least one primary blade intersects with the pass-through channel, wherein the at least one primary blade has a contact surface for contact with the plasma plume, and wherein the housing wall is configured to direct particles contacted by the contact surface of the at least one primary blade toward the drain opening; and
      a drain channel connected to the drain opening such that the drain channel extends from the housing.

13. The pulsed laser deposition device according to claim 12, wherein the contact surface comprises a concave shape facing in a rotation direction of the at least one primary blade.

14. The pulsed laser deposition device according to claim 13, wherein a cord line of a radial cross section of the contact surface makes an angle larger than 15 degrees with the rotation axis.

15. The pulsed laser deposition device according to claim 12, wherein the rotation axis is a rotation axis of the at least one primary blade, further comprising a disc rotatable arranged in the housing, wherein a rotation axis of the disc coincides with the rotation axis of the at least one primary blade, and wherein at least one pass-through opening is arranged in the disc.

16. The pulsed laser deposition device according to claim 15, wherein the at least one primary blade is arranged on the disc.

17. The pulsed laser deposition device according to claim 16, wherein the at least one primary blade is arranged adjacent to and trailing, when viewed in a rotation direction of the disc, the at least one pass-through opening in the disc.

18. The pulsed laser deposition device according to claim 16, wherein a cylindrical wall is arranged on the disc and concentrically with the rotation axis, and wherein the at least one primary blade connects to the cylindrical wall.

19. The pulsed laser deposition device according to claim 12, further comprising a secondary blade arranged rotatable around the rotation axis and trailing the at least one primary blade in a direction of rotation about the rotation axis.

20. A method of filtering particles in a pulsed laser deposition device comprising a filter including a housing, the method comprising:
   directing a pulsed laser at a target to generate a plasma plume and particles;
   passing the plasma plume and the particles into the housing through a first pass-through opening arranged in a housing wall of the housing;
   rotating at least one primary blade arranged within the housing such that the at least one primary blade passes through a portion of the plasma plume comprising the particles; and
   directing the particles through a drain channel extending from the housing wall by bouncing the particles from the primary blade and directing the particles with the housing wall to a drain opening arranged in a border on a radial outside of the housing wall, wherein the drain channel is connected to the drain opening.

* * * * *